United States Patent [19]
St. Onge

[11] Patent Number: 5,818,248
[45] Date of Patent: Oct. 6, 1998

[54] LOADED BOARD TEST FIXTURE WITH INTEGRAL TRANSLATOR FIXTURE FOR TESTING CLOSELY SPACED TEST SITES

[75] Inventor: Gary F. St. Onge, Ballston Lake, N.Y.

[73] Assignee: Delaware Capital Formation, Inc, Wilmington, Del.

[21] Appl. No.: 688,189

[22] Filed: Jul. 29, 1996

[51] Int. Cl.$^6$ .................................................. G01R 31/02
[52] U.S. Cl. .......................... 324/761; 324/754; 324/758
[58] Field of Search .................................... 324/754, 761, 324/755–758

[56] References Cited

U.S. PATENT DOCUMENTS

| | | | |
|---|---|---|---|
| 5,442,299 | 8/1995 | Caggiano | 324/758 |
| 5,493,230 | 2/1996 | Swart et al. | 324/754 |
| 5,523,698 | 6/1996 | Antonello et al. | 324/759 |
| 5,633,598 | 5/1997 | Van Loan et al. | 324/761 |
| 5,663,655 | 9/1997 | Johnston et al. | 324/761 |

Primary Examiner—Josie Ballato
Assistant Examiner—Russell M. Kobert
Attorney, Agent, or Firm—Christie, Parker & Hale, LLP

[57] ABSTRACT

A test fixture for testing a loaded printed circuit board having a plurality of test points includes a housing and a probe plate located in the base of the housing. The probe plate includes an array of widely spaced high spring force test probes in compliant contact with solid translator pins located in a translator fixture removably positioned over the probe plate. The translator fixture is positioned within a cavity in the housing adjacent the test points on the printed circuit board. The translator fixture includes a top plate having recessed portions for receipt of loaded circuit board components so that the top plate is adjacent the test points on the circuit board. The translator fixture aligns the translator pins to translate electrical test signals between the test points and an external electronic test analyzer electrically connected to the test probes. The translator pins can be adapted to rotate on their axes when applying such test forces by use of twisting test probes in an alternative embodiment.

11 Claims, 5 Drawing Sheets

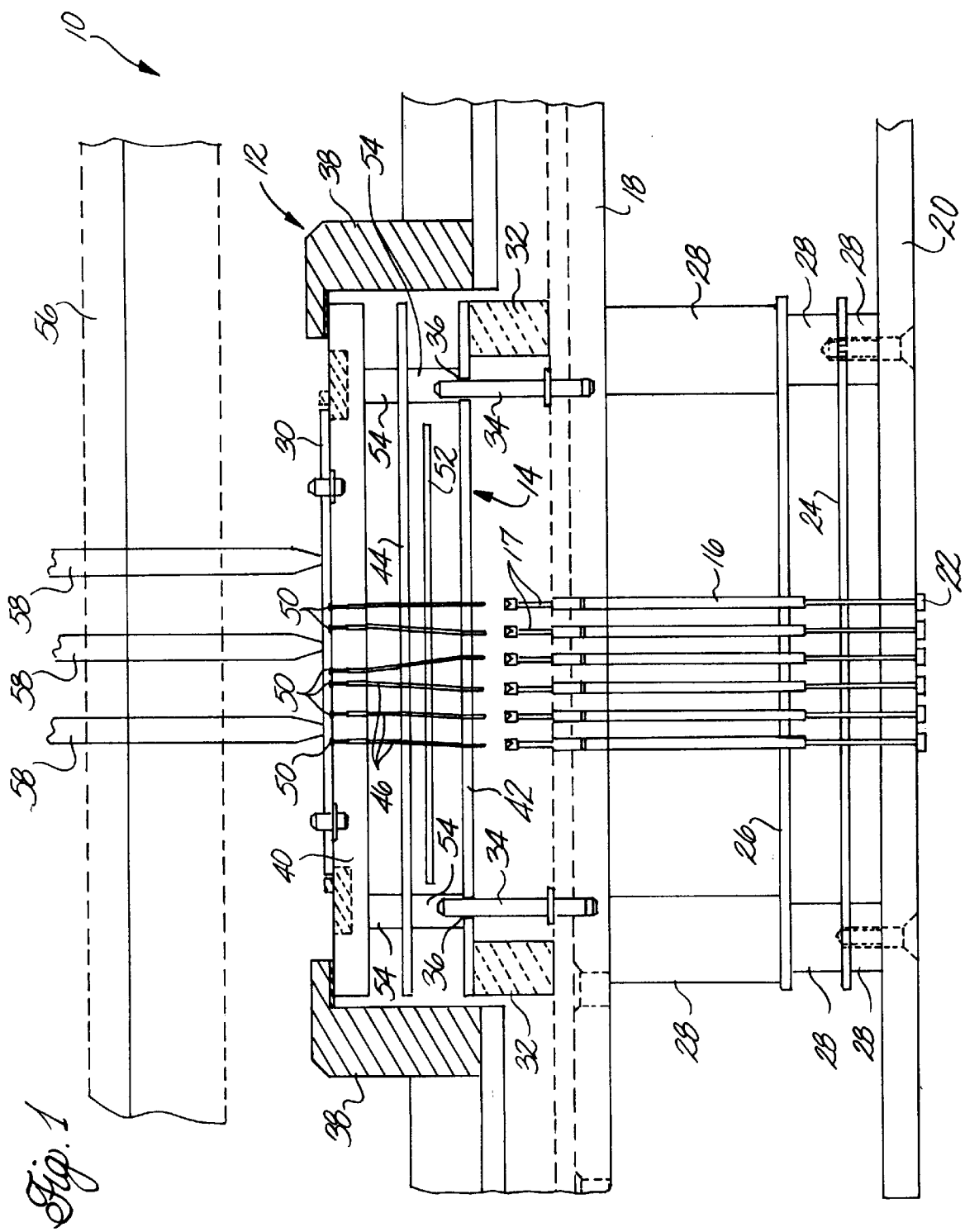

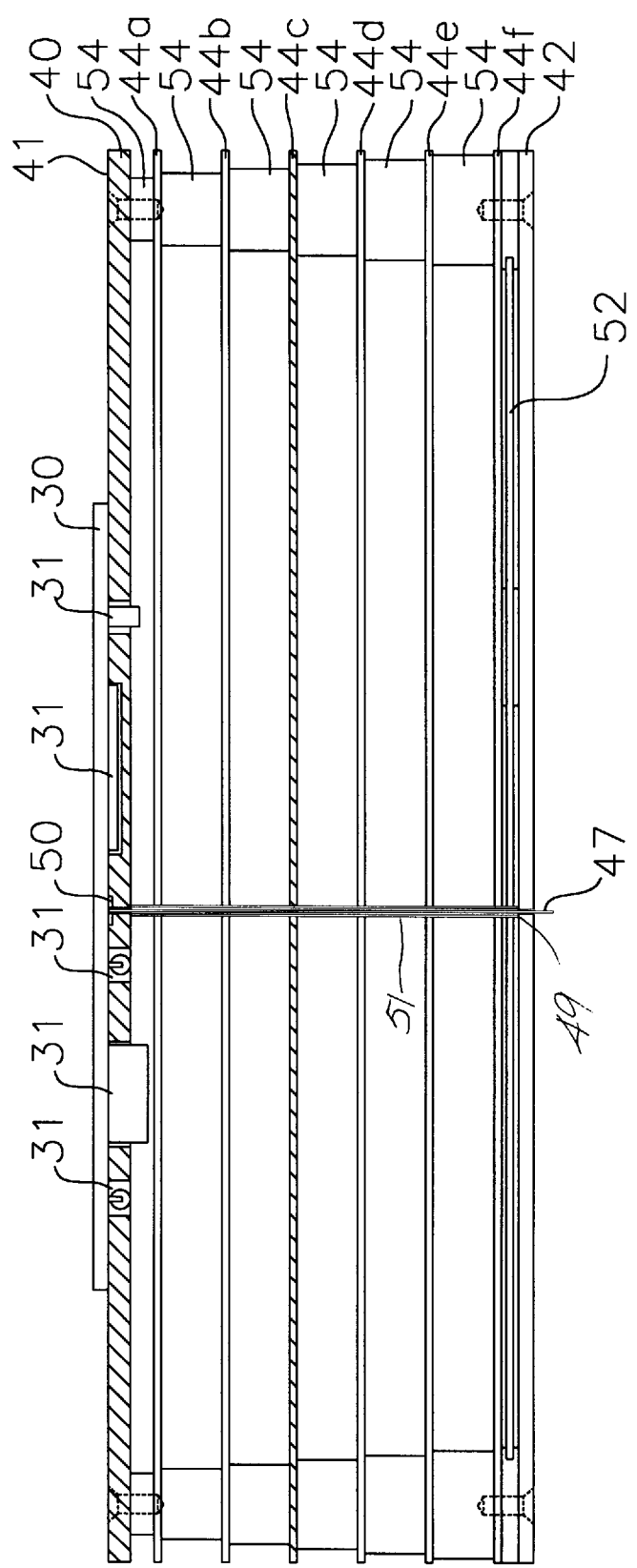

LOADED BOARD TEST FIXTURE WITH INTEGRAL TRANSLATOR FIXTURE FOR TESTING CLOSELY SPACED TEST SITES

FIELD OF THE INVENTION

This invention relates to test fixtures for the automatic testing of loaded printed circuit boards, and more particularly, to a test fixture having a translator fixture for testing high pitch density test patterns.

BACKGROUND OF THE INVENTION

Automatic test equipment for checking printed circuit boards has long involved the use of a "bed-of-nails" test fixture to which the circuit board is mounted during testing. This test fixture includes a large number of nail-like, spring loaded test probes arranged to make electrical contact under spring pressure with designated test points on the circuit board under test. Any particular circuit laid out on a printed circuit board (PCB) is likely to be different from other circuits, and consequently, the bed-of-nails arrangement for contacting test points in a particular circuit board must be customized for that circuit board. When the circuit to be tested is designed, a pattern of test points to be used in checking it is selected, and a corresponding array of test probes is configured in the test fixture. This method typically involves drilling a pattern of holes in a probe plate to match the customized array of test probes and then mounting the test probes in the drilled holes on the probe plate. The circuit board is then mounted in the fixture, superimposed on the array of test probes. During testing, the spring loaded test probes are brought into spring pressure contact with the test points on the circuit board under test. Electrical test signals are then transferred from the board to the test probes and then to the exterior of the fixture for communication with a high speed electronic test analyzer which detects continuity or lack of continuity between various test points in the circuits on the board.

Various approaches have been used in the past for bringing the test probes and the PCB under test into pressure contact for testing loaded printed circuit boards. One class of these fixtures is a wired test fixture in which the test probes are individually wired to separate interface contacts for use in transmitting test signals from the probes to the external electronically controlled test analyzer. These wired test fixtures or dedicated fixtures are often referred to as "vacuum test fixtures" since a vacuum may be applied to the interior of the test fixture housing during testing to compress the circuit board into contact with the test probes. Customized wire test fixtures of similar construction also can be made by using mechanical means, other than vacuum, to apply the spring force necessary for compressing the board into contact with the probes during testing.

Another class of test fixtures for testing bare printed circuit boards is the so-called grid type fixture in which the test points on the test side of a board are contacted by flexible pins or tilt pins which can move or otherwise be positioned to contact the random pattern of test points on the board and transfer test signals from the board to sets of interface pins arranged in a grid pattern on the receiver. In these grid type testers, fixturing is generally less complex and simpler than in the customized wired test fixtures because there is no need to individually hard wire the test probes to separate interface contacts for each differently configured circuit to be tested; but with a grid system, the grid interfaces and test electronics are substantially more complex and costly.

In a grid type fixture for bare circuit board testing, the wiring for the grid array remains constant, independent of the configuration of the particular circuit board. What does change, however, is what is referred to as the translator fixture. The translator fixture includes a bottom plate having a hole pattern corresponding to the grid pattern of openings in a standard pin grid array, and a top plate having a hole pattern corresponding to the random off-grid pattern of contact points to be tested on a printed circuit board. A number of electrically conductive translator pins (these can be flexible pins or rigid tilt pins) are mounted in the holes of the top and bottom plates. As the translator pins travel through the translator fixture they are redirected by the hole patterns of the plates to provide individual conductive paths between the standard grid pattern and the off-grid pattern corresponding to the test points on the circuit board under test. Extreme contact accuracy can be achieved between the translator pin and the test pad on the PCB because the translator pin does not extend beyond the upper surface of the top plate. The top plate in effect can accurately direct the translator pin precisely to the test pad through the holes in the top plate.

The construction of the grid type translator fixture is typically less labor intensive than the rewiring of test probes in a wired type test fixture, making it simpler to customize the fixture to accommodate PCB's with different test point patterns. Therefore, it is often desirable to use a grid type test fixture when testing printed circuit boards having various different shapes and/or configurations.

The present invention is directed to test fixtures for testing loaded circuit boards. A problem encountered with these types of test fixtures for testing loaded circuit boards is the ability to test high density test points on the printed circuit board. Many PCB tests utilize fine pitch test point arrangements, i.e., a spacing of 50 mils or less between test points. However, spring probes suitable for fine pitch spacing on the probe plate do not have a spring force sufficient to provide good electrical contact with the test points on the PCB. The present invention overcomes this problem by translating a higher density probe arrangement at the interface between the test probes and the PCB under test into a wider-spaced probe arrangement, typically 100 mils on center, in the test fixture. Having a test probe pattern on the probe plate with a sufficiently wide spacing permits the use of heavy duty spring probes, commonly referred to as 100 mil spring probes, which deliver a greater spring force, providing better electrical contact. This force is translated through tilt pins, providing better electrical contact with a fine pitch test point arrangement on the PCB under test.

Another problem with testing loaded circuit boards having high test point densities is obtaining good electrical contact with the test points. The printed circuit board becomes "dirty" during loading and cannot be cleaned by solvents normally used on bare boards. Solvents which contain fluorocarbons, normally used to remove excess fluxes, may damage the loaded components. Consequently, good electrical contact with the desired test point can be difficult to obtain due to the excess flux generated during loading.

Still another problem with current test fixtures for testing loaded circuit boards is that because the test probes extend beyond the top surface of the fixture and in between the circuit board components to reach the desired test pad, accuracy of contact between the plunger of the test probe and the test pad is difficult to maintain. Once the plunger of the test probes extends from the barrel of the probes, the plunger is no longer being guided and has a tendency to move other than in a straight line. This moving of the plunger can cause the plunger to miss the desired test pad and adversely effect the test results.

Therefore, a need exists for an improved test fixture for testing loaded printed circuit boards capable of testing high density test points which may be contaminated, and being capable of accurately testing the PCB.

SUMMARY OF THE INVENTION

One embodiment of the invention comprises a vacuum, pneumatic or mechanical test fixture having a removable translator fixture for translating a wide-spacing probe pattern to a fine pitch test pattern. The wide-spacing probe pattern corresponds to a probe pattern in the base of the test fixture with sufficient spacing to accommodate 100 mil spring probes capable of delivering substantially more spring force than the spring probes commonly used to test high density test point arrangements for loaded circuit boards. The fine pitch test pattern corresponds to a high density test point arrangement on the loaded PCB under test.

The translator fixture comprises at least a top translator plate and bottom translator plate both of which include holes. The holes in the top plate are arranged in a fine-pitch pattern, and the holes in the bottom plate are arranged in a wide-spacing pattern. The upper surface of the top translator plate is routed out to accommodate the components of the loaded board. Tilt pins are positioned between the translator plates, approximately perpendicular to the translator plates, wherein the bottom end of each tilt pin passes through the holes in the bottom translator plate and the top ends of the tilt pins extends into the holes in the top translator plate and are flush with the top surface of the top plate. The top ends of the tilt pins contact the test points on the circuit board under test and the bottom ends contact the 100 mil spring probes in the base of the test fixture. The spring probes are also electrically connected to an external electronic test analyzer.

When mechanical, pneumatic or vacuum pressure is applied to the test fixture, the 100 mil spring probes apply a force to the tilt pins in the translator fixture which is translated to the test points. The tilt pins in the fixture do not extend beyond the surface plane of the top plate of the fixture thereby increasing accuracy. The force translated from the 100 mil spring probes provides good electrical contact between the tilt pins and the test points which is particularly important in the case of high density test points.

The invention in another embodiment provides helix or twister probes in the vacuum test fixture. These probes twist the tilt pins in the translator cartridge providing good twisting contact between the tip of the pin and the test point on the circuit board which is particularly useful for contaminated test pads.

In still another embodiment, the spring probes in the base of the test fixture are double-ended and connected to a short-wire interface panel. This provides the advantage of allowing the fixture to accommodate PCB's with different test point arrangements without moving the spring probes.

These and other features and advantages of the present invention will be better understood with reference to the following detailed description and the accompanying drawings.

BRIEF DESCRIPTION OF THE DRAWINGS

FIG. 1 is a fragmentary, schematic cross sectional view of the loaded board drop pin test fixture of the present invention;

FIG. 2 is a schematic side elevational view of an alternative translator fixture of FIG. 1;

DETAILED DESCRIPTION

Figure 3A:
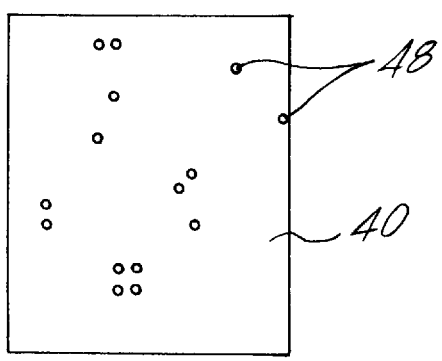
FIG. 3a is a top view of the translator fixture of FIG. 1.

FIG. 1 illustrates a loaded board drop pin fixture 10 in accordance with the principles of this invention. The drop pin fixture is principally used to align a printed circuit board in a test position in an electronic test analyzer. The invention is particularly useful in the testing of loaded circuit boards as distinguished from bare boards. The drop pin fixture 10 comprises a vacuum test fixture 12 and a translator fixture 14 removably positioned within the vacuum fixture. The vacuum fixture includes a plurality of electronically conductive spring probes 16 positioned in corresponding holes in a non-conductive upper probe plate 18 located in the fixture. The spring probes are arranged in a hole pattern sufficiently far apart to accommodate spring probes, preferably spaced apart 100 mils on center. The 100 mil spring probes should be able to deliver a sufficient spring force in the range of about 6 to about 12 ounces. Typical 100 mil spring probes are made from a beryllium copper alloy and include an outer receptacle, a barrel in the outer receptacle, a plunger 17 projecting from the barrel, and a compression spring inside the barrel for applying a biasing force to the plunger which reciprocates outside the barrel under spring pressure in a well known manner.

The 100 mil spring probes extend downwardly through a non-conductive base 20 of the vacuum fixture where terminals 22 at the bottom ends of the spring probes are electrically connected to an external electronic test analyzer (not shown). Intermediate probe plates 24 and 26 are positioned between the base 20 of the fixture and the upper probe plate 18 for guiding the spring probes 16. Individual spacers 28 are located between the base 20 and the upper probe plate 18 for positioning the intermediate probe plates 24 and 26. Holes are drilled in plates 24 and 26 for the passage of the spring probes 16, which are aligned parallel to one another, preferably in vertical axes, uniformly spaced apart in two-dimensional rows across the fixture.

The translator fixture 14 is positioned in the vacuum fixture 12 corresponding to the location of high density test points on a loaded printed circuit board 30 which is tested by the fixture 10 and test electronics. The translator fixture 14 is suspended above the upper probe plate 18 in the vacuum fixture by support pads 32 positioned on the upper surface of the upper probe plate 18. Support pads 32 are preferably made from an elastomeric material. Metal guideposts 34 are also positioned in the probe plate, for aligning the translator fixture, and they extend upwardly through holes 36 in the bottom of the translator fixture. The translator fixture is held against the support blocks 32 and on the guideposts 34 by housing 38 which extends around the perimeter of the top surface of the translator fixture.

The translator fixture comprises an upper translator plate 40, a lower translator plate 42, and an intermediate translator plate 44. Although the translator fixture is illustrated in FIG. 1 as having three translator plates, it is to be understood that any number of plates can be incorporated into the translator fixture as required for a particular application. FIG. 2, for example, illustrates a translator fixture with six intermediate plates 44 a–f.

Flexible solid translator pins 46 are arranged approximately perpendicularly between the top translator plate and the bottom translator plate. (The pins are referred to as solid pins in the sense that they are distinguished from multi-component test probes which incorporate a barrel, plunger and a compression spring.) Preferably solid nonflexible tilt pins 47, one of which is shown in FIG. 2 for simplicity, are utilized as the translator pins. A problem encountered when testing a loaded board with high density test points is that the circuit board components may emit a frequency, and when metal tilt pins are close to the component and each other, interference is created between the pins which can effect the test results. Consequently, the interference can be eliminated by insulating and grounding the tilt pins 47. This is accomplished by shielding the tilt pins in a nylon tube 49 and then grounding the shielded pin by a combination of a metal tube 51 around the nylon tube and making one intermediate translator plate, such as plate 44C metal.

Figure 3B:
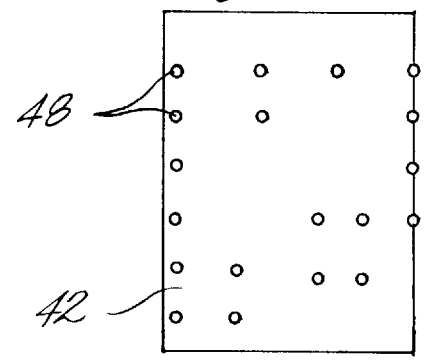
FIG. 3b is a bottom view of the translator fixture of FIG. 1.

The translator plates have guide holes 48 as shown in FIGS. 3a and 3b with diameters large enough to allow the translator pins to freely pass through the plates. The bottom ends of each tilt pin 47 extends beyond the bottom surface of the bottom translator plate 42. The top ends of tilt pins 47 are flush with the top surface of the top plate 40. Holes 48 in top plate 40 are arranged in a high density pattern corresponding to the pattern and density of test points on the loaded printed circuit board. Holes 48 in bottom pin plate 42 are arranged in a uniform grid pattern corresponding to the array of spring probes 16 in the vacuum fixture 12. Tilt pins 47 translate electrical test signals from the test pads 50 on the lower surface of the printed circuit board 30 to the spring probes 16. The top surface 41 of top translator plate 40 is routed to accommodate components 31 of board 30 so that test pads 50 are flush with surface 41 and the top ends of the tilt pins. By routing top plate 40 extreme accuracy between tilt pins 47 and test pads 50 is achieved because the top plate continually guides the tilt pins.

Tilt pins 47 are retained within the translator fixture by a latex pin retention sheet 52 positioned between bottom translator plate 42 and intermediate translator plate 44. Separate spacer elements 54 are positioned between the translator plates to maintain their position.

As seen in FIG. 1, a hold-down gate 56, of vacuum fixture 12, includes downwardly projecting fingers 58 which contact the upper surface of the printed circuit board and hold the printed circuit board against the top translator plate 40 of the translator fixture. A vacuum is applied to the interior of the test fixture during testing to also maintain contact of the printed circuit board in the test fixture. The vacuum created within the fixture causes the spring loaded test probes in the probe plate to impose an upward force to the bottom ends of the tilt pins in the translator fixture, this force is translated to the top ends of the tilt pins which are in contact with the test points on the bottom surface of the printed circuit board. The tilt pins are sufficiently rigid axially that they retain compliant high spring pressure applied through the spring probes during the test cycle. The intermediate translator plates help guide the tilt pins as they contact the circuit board.

An advantage achieved by the present invention is that the vacuum test fixture can be used to test various circuit boards with different test point patterns corresponding to the test points on the circuit board. The advantage is realized by providing a translator fixture which can be easily removed and replaced with separate translator fixtures. This avoids the need to rearrange the spring probes in the vacuum fixture or rewire the spring probes.

Another advantage of the invention is the ability to produce a high pitch density of tilt pins at the top of the translator fixture for contact with the high density pattern of test points on the loaded board under test. Pins with as small as 10 mil spacing at the top of the translator fixture are possible. Spacing below 50 mils on center is considered a high pitch density with standard loaded boards. The 100 mil spring probes provide high spring force and the resulting spring compliancing necessary for testing.

Figure 4:
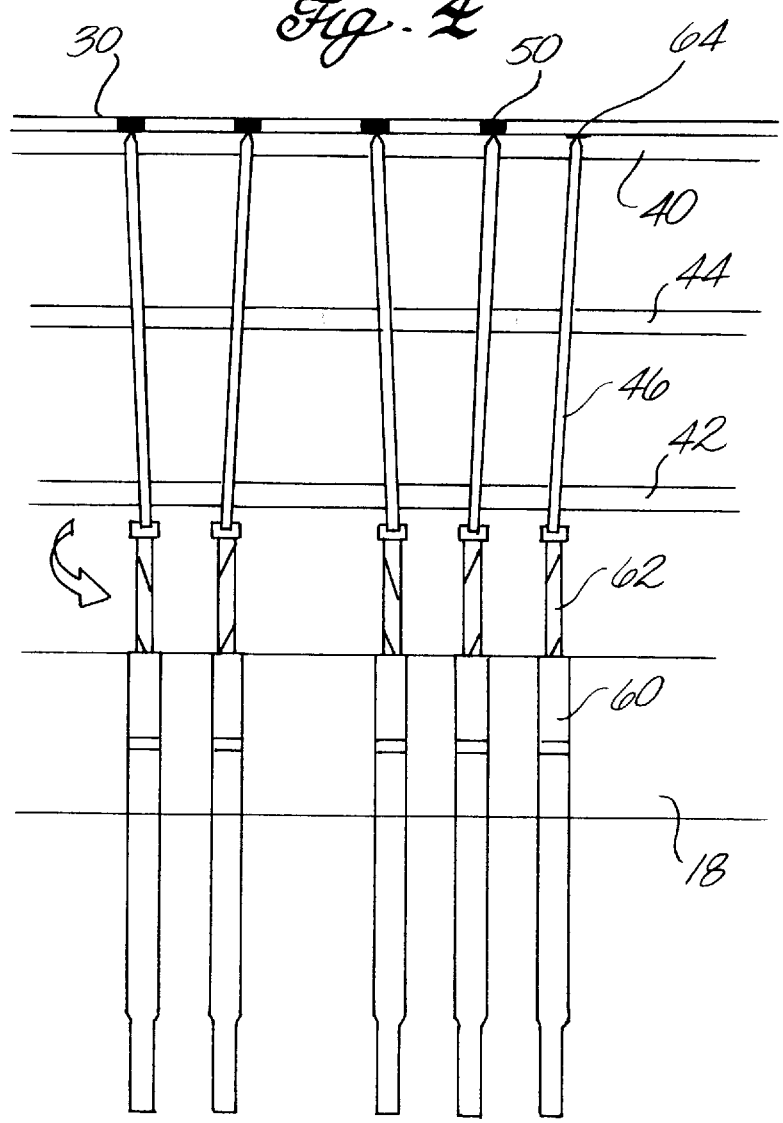
FIG. 4 is a fragmentary schematic side elevational view of an alternative test fixture embodiment incorporating helix probes.

FIG. 4 illustrates an alternative embodiment of the invention in which helix probes 60 are used in place of conventional 100 mil spring probes. Typical helix probes are those disclosed in Everett Charles Technologies U.S. Pat. No. 5,032,787, the disclosure of which is incorporated herein by reference. The helix probes rotate under compliance spring pressure as the plunger 62 of the probe is forced downwardly into the outer barrel. The helix probes contact the bottoms of individual tilt pins 46 in the translator fixture, and the tilt pins are rotated about their axes when the downward force is applied during testing. The purpose of rotating the tilt pins is to produce good twisting contact between the tip 64 of the pin and the test point 50 on the printed circuit board 30. Helix probes are particularly useful in addressing the problems of test pads that are dirty because of fluxes used in producing loaded circuit boards which are not cleaned by normal cleaning methods. The use of helix probes provides good twisting contact for the high density test points and allows the use of tilt pins that are made of stainless steel which are harder and more durable pins that stay sharper longer.

Figure 5:
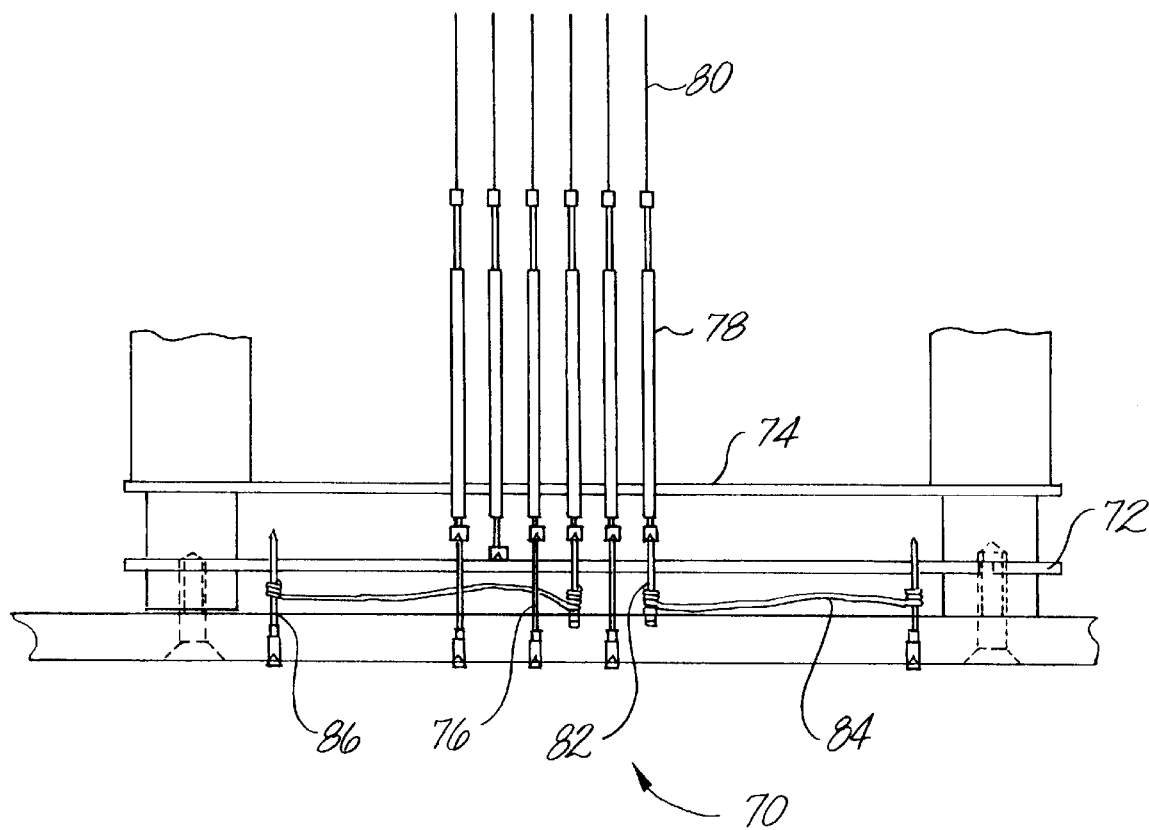
FIG. 5 is a fragmentary schematic cross-sectional view of a second alternative embodiment test fixture incorporating a short-wire interface panel.

A second alternative embodiment of the invention is illustrated in FIG. 5. FIG. 5 illustrates the use of the invention in a short-wire test fixture 70. Previously, it has been difficult to align pins in a short-wire panel at the bottom of the fixture with tilt pins that contact the test points of the printed circuit board. In the present invention, the alignment problem is avoided by incorporating a short-wire interface panel 72 in the bottom of the fixture 70 below the probe plate 74. The short-wire panel has pins 76 arranged below double-ended spring loaded test probes 78 carried in the probe plate 74. The pins 76 in the short-wire panel contact the bottoms of the double-ended spring probes which can be high spring force probes. Tilt pins 80 in the translator fixture (not shown) engage the tops of the double-ended probes and can be angled to make necessary contact with the test point pattern on the board under test.

The short-wire interface panel has fixed pins 82 below the probes 78 which are hard wired 84 to the standard interface pins 86 (SIPS) at the periphery of the short-wire interface panel 72. An external electronic test analyzer makes contact with the standard interface pins for conducting the test. The fixture 70 incorporates the translator fixture in combination with the double-ended spring probes and the short-wire interface panel to provide proper alignment between the pins in the short-wire interface panel and the tops of the translator pins and make contact with the test points on the circuit board. The double-ended probes that are short-wired are those that do not align directly over the grid of the tester interface. In a short-wire fixture, the probes cannot be moved around on the probe plate. However, the translator fixture solves this problem by translating the position of the spring loaded probe to the desired test point on the printed circuit board by way of the tilt pins. Alternatively, a printed circuit board can be utilized as the interface panel for the electronic test analyzer instead of a short-wire interface panel which would eliminate wiring in the interface panel and would incorporate pads instead of pins.

Figure 6:
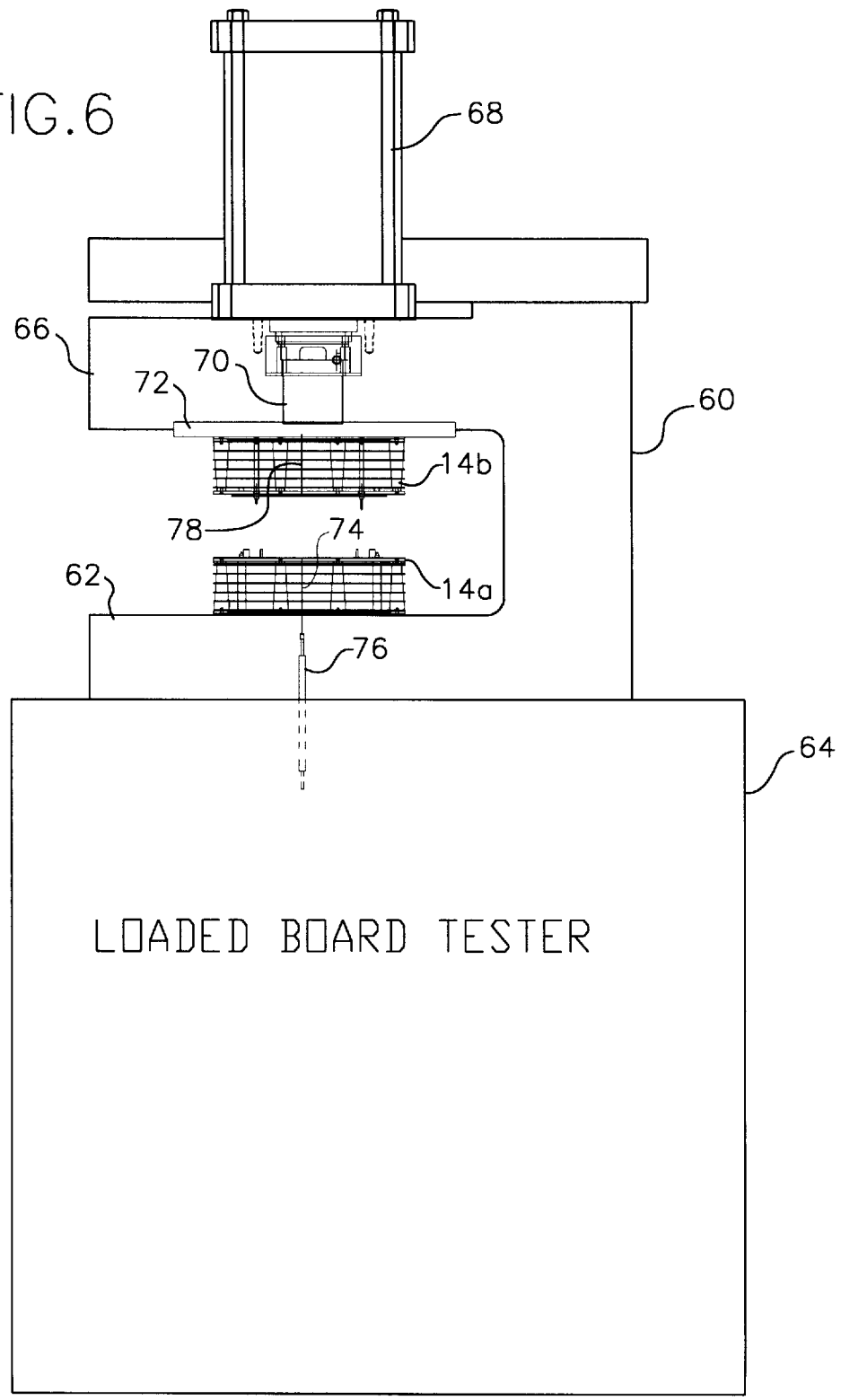
FIG. 6 is a schematic side elevational view of an alternative embodiment test fixture of FIG. 1.

A third embodiment for the present invention is illustrated in FIG. 6. In this embodiment two translator fixtures, 14a and 14b, are positioned in a C-frame receiver 60 wherein fixture 14b is inverted and axially aligned with fixture 14a. Fixture 14a is positioned on the lower leg 62 of the C-frame receiver 60 which is positioned on a standard loaded circuit board tester 64 such as a Hewlett Packard 3070 tester. Upper leg 66 of C-frame receiver 60 supports a actuating member 68, such as an air cylinder having a cylinder rod 70 attached to a platform 72. Fixture 14b is positioned on platform 72 which is actuated by the air cylinder for moving fixture 14b adjacent to fixture 14a for testing a circuit board. Tilt pins 74 are superimposed on an array of test probes 76 located in tester 64 as commonly known. Only one tilt pin and one test probe are illustrated for simplicity. Similarly, tilt pins 78 in upper translator fixture 14b can be separately wired to the test electronics in the loaded circuit board 64.

What is claimed is:

1. A loaded board test fixture for testing a plurality of closely spaced test points on a loaded printed circuit board comprising:

a housing;

a probe plate located in a base of the housing;

an array of relatively widely spaced apart high spring force test probes extending through the probe plate and adapted for electrically connecting to an external electronic test analyzer;

a translator fixture removably positioned over the probe plate within a cavity in the housing and adjacent the closely spaced test points on the circuit board;

said translator fixture having a top plate with recessed portions for receipt of circuit board components so that an upper surface of the top plate is adjacent the test points on the loaded printed circuit board; and a plurality of translator pins supported in the translator fixture for alignment with the test probes at one end of the translator fixture and with the closely spaced test points at the opposite end of the translator fixture, the translator pins comprising solid pins having sufficient axial rigidity to effectively translate test forces applied by the test probes to the test points on the board, and wherein the test probes are in compliant contact with the translator pins for translating said test forces and electrical test signals between the closely spaced test points on the printed circuit board and the connections to the external electronic test analyzer.

2. The fixture of claim 1 wherein the test probes exert a spring force of about 6 ounces.

3. The fixture of claim 1 wherein the test probes exert a force from about 6 to about 12 ounces.

4. The fixture of claim 1 wherein the test probes are spaced about 100 mills on center through the probe plate.

5. The fixture of claim 4 wherein the test points include individual test locations spaced 50 mils or less apart.

6. The test fixture of claim 1 wherein the test probes are helix probes which rotate under compliant spring pressure to rotate the translator pins producing twisting contact between the translator pin and the test points on the printed circuit board.

7. The fixture of claim 1 wherein the fixture further includes a short-wire interface panel positioned below the probe plate for electrically connecting the test probes and the electronic test analyzer.

8. The fixture of claim 7 wherein the short-wire interface panel includes interface pins in contact with the test probes, the interface pins are hard wired to standard interface pins at a periphery of the short-wire interface panel.

9. The fixture of claim 1 wherein the housing is a vacuum wired fixture.

10. The fixture of claim 1 wherein the housing is a mechanical wired fixture.

11. The fixture of claim 1 wherein the housing is a pneumatic wired fixture.

* * * * *